United States Patent
Nanda et al.

(10) Patent No.: US 7,348,813 B1
(45) Date of Patent: Mar. 25, 2008

(54) CIRCUITS AND METHODS FOR REDUCING THE EFFECTS OF LEVEL SHIFTER DELAYS IN SYSTEMS OPERATING IN MULTIPLE VOLTAGE DOMAINS

(75) Inventors: Kartik Nanda, Austin, TX (US); Aryesh Amar, Austin, TX (US); Rahul Singh, Austin, TX (US); Jerome E Johnston, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 4 days.

(21) Appl. No.: 11/292,523

(22) Filed: Dec. 2, 2005

(51) Int. Cl.
*H03L 7/00* (2006.01)
(52) U.S. Cl. ........................ 327/141; 327/333
(58) Field of Classification Search ............ None
See application file for complete search history.

(56) References Cited

U.S. PATENT DOCUMENTS

| | | | |
|---|---|---|---|
| 5,570,397 A * | 10/1996 | Kubista | 375/356 |
| 5,578,946 A * | 11/1996 | Carberry et al. | 326/93 |
| 5,809,543 A * | 9/1998 | Byers et al. | 711/162 |
| 5,933,043 A | 8/1999 | Utsunomiya | |
| 6,359,492 B1 * | 3/2002 | Hipp | 327/333 |
| 6,717,452 B2 * | 4/2004 | Carpenter et al. | 327/333 |
| 6,717,453 B2 | 4/2004 | Aoki | |
| 6,751,279 B1 * | 6/2004 | Hipp | 375/376 |
| 6,774,696 B2 * | 8/2004 | Clark et al. | 327/333 |
| 6,853,234 B2 | 2/2005 | Bucossi | |
| 7,093,144 B2 * | 8/2006 | Skroch | 713/300 |

* cited by examiner

*Primary Examiner*—Cassandra Cox
(74) *Attorney, Agent, or Firm*—James J. Murphy; Thompson & Knight LLP

(57) ABSTRACT

A method of interfacing circuits operating in different voltage domains includes receiving a first signal with a first circuit operating in a first voltage domain and generating a second signal with a second circuit operating in a second voltage domain. The second signal is level shifted between the first and second voltage domains with a level shifter and synchronized with the first signal with a third circuit operating in the first voltage domain.

18 Claims, 4 Drawing Sheets

CIRCUITS AND METHODS FOR REDUCING THE EFFECTS OF LEVEL SHIFTER DELAYS IN SYSTEMS OPERATING IN MULTIPLE VOLTAGE DOMAINS

FIELD OF INVENTION

The present invention relates in general to mixed-signal processing techniques, and in particular, to circuits and methods for reducing the effects of level shifter delays in systems operating in multiple voltage domains.

BACKGROUND OF INVENTION

Often integrated circuit devices include circuits that operate in different voltage domains. For example, the core logic of a data processing integrated circuit may operate in a voltage domain that is suitable for the given overall circuit design scheme or fabrication process being implemented, while the associated input and output circuits may operate in another voltage domain, as required to maintain compatibility with corresponding external devices and systems. In such integrated circuits, voltage level shifters are required to translate signals from the voltage swing utilized in one voltage domain to the voltage swing utilized in another voltage domain as those signals cross voltage domain boundaries.

Disadvantageously, voltage level shifters introduce signal path delay, which can directly impact overall system performance, especially when those voltage level shifters are required in critical timing paths. For example, in a typical serial data port, commonly used in analog to digital converters (ADCs), the bits of a serial data (SDATA) stream are output on the falling edges of an associated serial clock (SCLK) signal, which, in the slave (asynchronous) mode, is provided by the destination device receiving the SDATA stream. Each bit of serial data output from the source device on the falling edge of the SCLK signal is latched on the next rising edge of the SCLK signal by the destination device. Hence, minimizing the delay between the receipt of the falling edge of the SCLK signal at the source device and the resulting output of the corresponding SDATA bit is critical, since sufficient time must be provided between the output of the SDATA bit by the source device and the following rising edge of the SCLK signal to allow for set-up at the destination device. When voltage level shifters are included in the SCLK signal path and/or the SDATA data path, the timing margins are reduced, which in turn limits the maximum frequency of the SCLK signal.

Given the utility of integrated circuits that include circuits operating in different voltage domains, techniques are required for minimizing the impact on system performance caused voltage level shifters delays. In particular, these techniques should provide for improved performance in multiple voltage domain integrated circuits operating in response to high frequency clock signals, such as those utilized in serial data ports.

SUMMARY OF INVENTION

The principles of the present invention are embodied in techniques which limit the signal delays introduced by the level shifters that are commonly used in circuits and systems operating in multiple voltage domains. According to one representative embodiment, a method is disclosed for interfacing circuits operating in different voltage domains that includes receiving a first signal with a first circuit operating in a first voltage domain and generating a second signal with a second circuit operating in a second voltage domain. The second signal is level shifted between the first and second voltage domains with a level shifter and synchronized with the first signal with a third circuit operating in the first voltage domain.

Since the first signal never passes through a level shifter, the delay between the receipt of an active edge of the first signal and the output of the second signal by the circuit is reduced. As a result, the frequency of the first signal can be increased and/or more set-up time made available to external circuits driven by the third circuit, depending on the given system.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
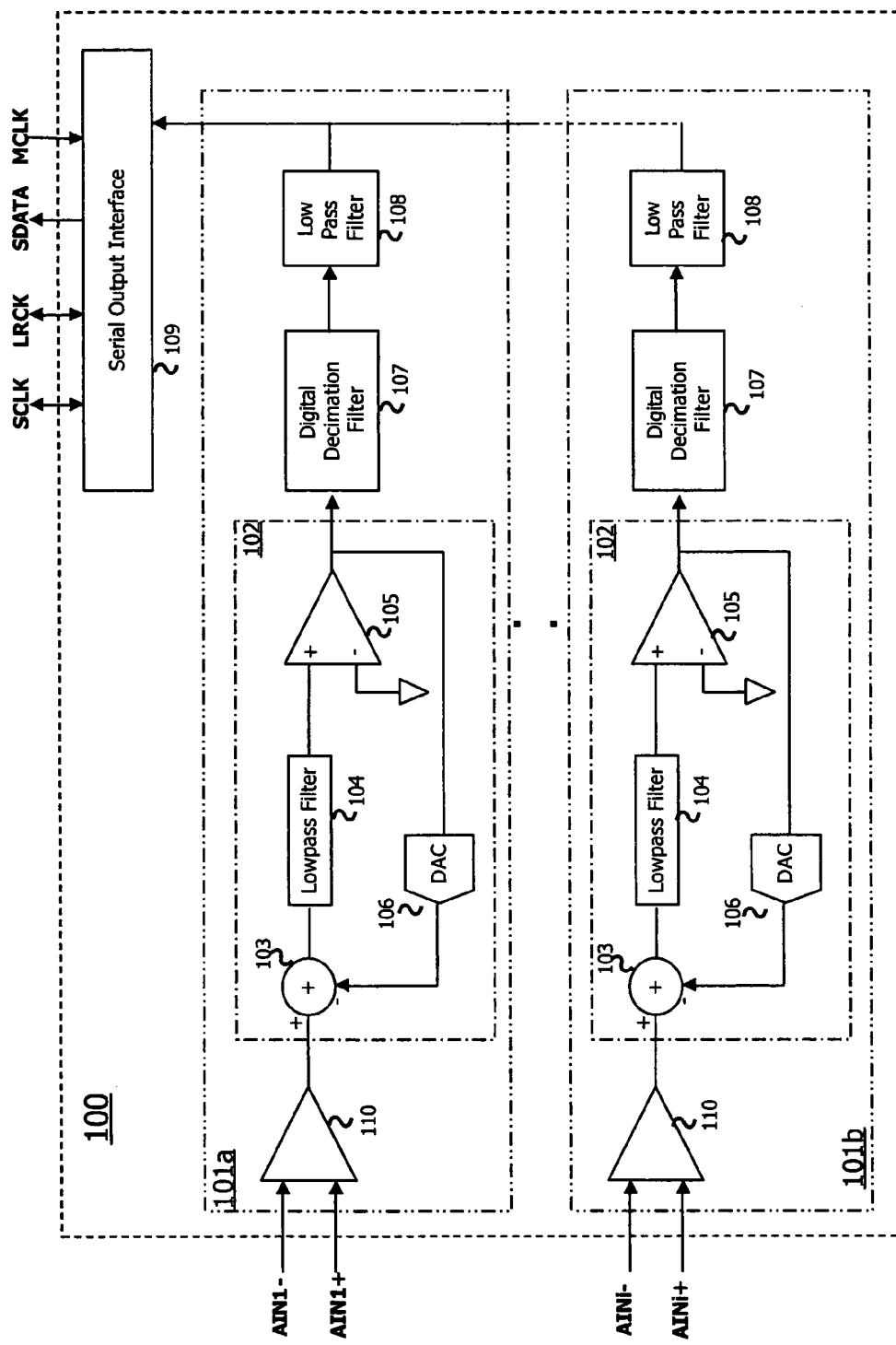
FIG. 1 is a high level block diagram of an analog to digital converter (ADC) system suitable for describing a representative application of the present inventive principles.

The principles of the present invention and their advantages are best understood by referring to the illustrated embodiment depicted in FIGS. 1-3 of the drawings, in which like numbers designate like parts.

FIG. 1 is a high voltage level functional block diagram of a single-chip analog-to-digital converter (ADC) 100 suitable for describing the principles of the present invention. ADC 100 may be used in any one of a wide range of systems including instrumentation systems, audio processing systems, and video processing systems, to name only a few examples. Furthermore, ADC 100 is only one of a number of possible integrated circuit applications in which the present inventive principles can advantageously be utilized. Other integrated circuit examples include digital to analog converters (DACs), -encoder-decoders (Codecs), general purpose microprocessors, controllers, and digital signal processors.

ADC 100 includes n-number of conversion paths, two of which, 101a and 101b, are shown for reference, for converting n-number of channels of analog data respectively received at left and right analog differential inputs AlNi+/−, where i is the channel number from 1 to n. The analog inputs for each channel are passed through an input gain stage 110 and then to a delta-sigma modulator 102.

Each delta-sigma modulator 102 is represented in FIG. 1 by a summer 103, low-pass filter 104, comparator (quantizer) 105 and a DAC 106 in the modulator feedback loop.

The outputs from the delta-sigma modulators are passed through a decimation filter 107, which reduces the sample rate, and a low pass filter 108.

The resulting digital data are output through a single serial port SDATA of serial output interface 109, timed with a serial clock (SCLK) signal and a left-right clock (LRCK) signal. In the slave mode, the SCLK and LRCK signals are generated externally and input to converter 100, along with the MCLK signal. In the master mode, the SCLK and LRCK signals generated on-chip, along with the associated data, in response to a received master clock MCLK signal.

Figure 2A:
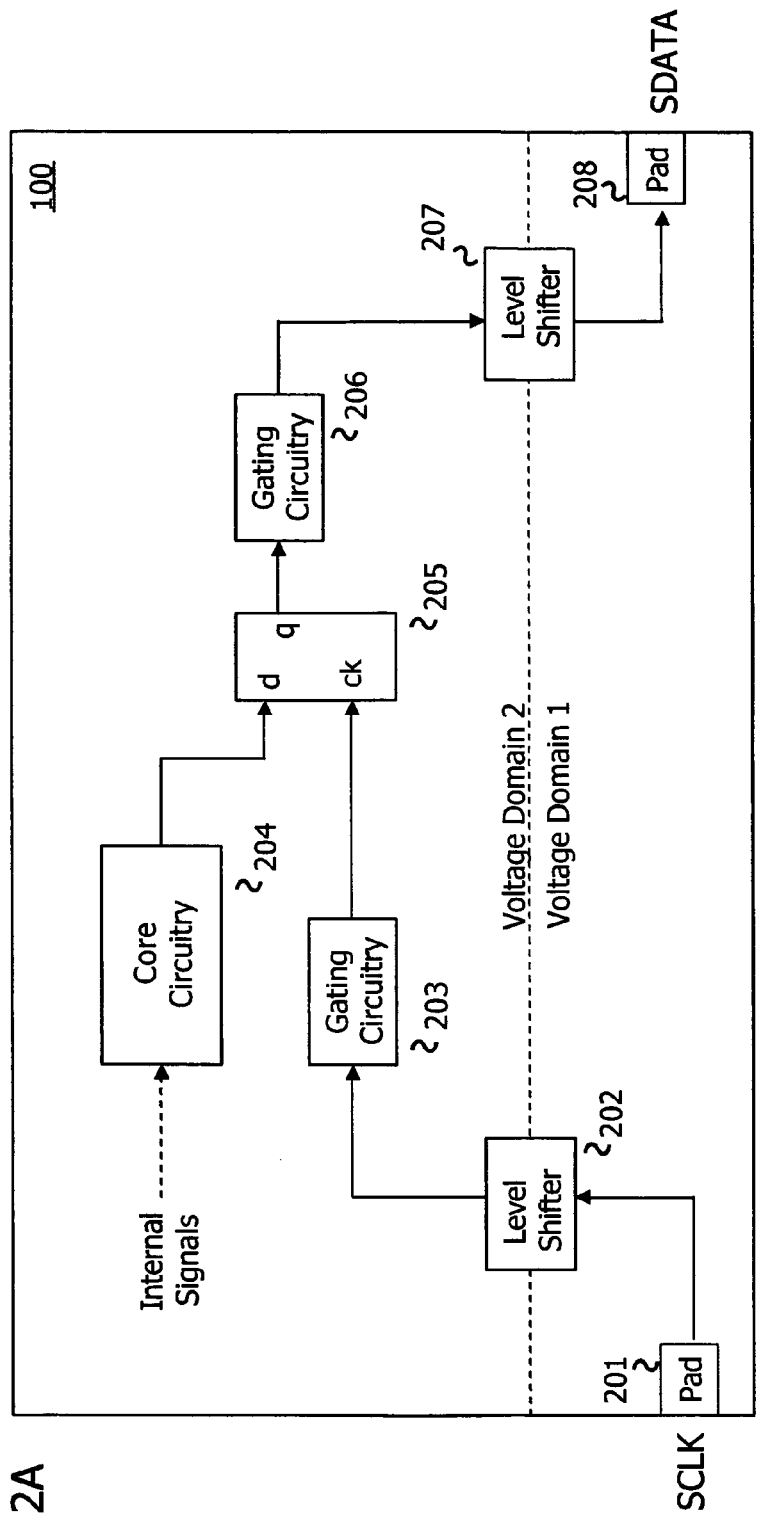
FIG. 2A is a block diagram of a typical serial data processing path suitable for utilization in an ADC such as that shown in FIG. 1.

FIG. 2A is a block diagram illustrating a portion of the serial data path of one conversion path 101a-101b of a representative embodiment of ADC 100. In the example shown in FIG. 2A, ADC 100 operates in two different voltage domains, generally labeled voltage domain 1 and voltage domain 2. Generally, voltage domain 1 is selected to maintain compatibility with associated external devices and voltage domain 2 is selected based on the circuit design and process used for the core circuitry 204 of ADC 100, which includes, for example, delta sigma modulators 102, decimation filters 107, and lowpass filters 108 of FIG. 1.

In some integrated circuits operating from single positive polarity voltage rails, voltage domain 1 may be based on power supply voltage rails of 0 and 1.8 volts, 0 and 2.5 volts, 0 and 3.0 volts, or 0 and 5.0 volts, depending on the voltage swing of the signals being transmitted and received from the external devices. Voltage domain 2 may be, for example, based on power supply voltage rails of 0 and 1.8 volts, 0 and 2.5 volts, 0 and 3.0 volts, or 0 and 5.0 volts. In other integrated circuits, voltage domain 1 and/or voltage domain 2 may be based on a single negative polarity voltage rail. An example of a single rail negative polarity voltage domain is one operating between voltage rails of −2.5 and 0 volts. Additionally, voltage domain 1 and/or voltage domain 2 may be based on double polarity voltage rails, such voltage rails of −2.5 and 2.5 volts. In embodiments where voltage domain 1 and voltage domain 2 differ, voltage level shifters are required to shift the voltage levels of signals crossing between voltage domains. Level shifting may be in either direction (i.e. increasing or decreasing in voltage) between single positive polarity voltage rails, negative polarity voltage rails, positive and negative voltage rails, and single and double polarity voltage rails.

In the embodiment shown in FIG. 2A, the SCLK signal is received in the asynchronous mode at pad 201 in voltage domain 1 and then shifted by voltage level shifter 202 into voltage domain 2. For example, if the SCLK signal is received at pad 201 with a voltage swing of 0-3 volts and core circuitry 204 is operating in voltage domain 2 on signals with a voltage swing of 0-2.5 volts, then the high voltage levels of the SCLK signal are shifted down from 3.0 volts to 2.5 volts by voltage level shifter 202. The level shifted SCLK signal is then passed through gating circuitry 203. Concurrently, internal serial data ISDATA are generated within core circuitry 204 in response to various other internal signals. The internal serial data ISDATA is then synchronized with the level shifted SCLK signal output from gating circuitry 203 in synchronization circuitry 205, which is represented in FIG. 2A by a flip flop. The internal serial data ISDATA, which is now synchronized with the SCLK signal, is then passed through additional gating circuitry 206 and then voltage level shifted by voltage level shifter 207 into voltage domain 1 for output through pad 208. In the present example where signals in voltage domain 1 have a voltage swing of 0-3 volts and signals in voltage domain 2 have a voltage swing of 0-2.5 volts, level shifter 207 shifts up the serial data output from gating circuitry 206 from a voltage swing of 0-2.5 volts to a voltage swing of 0-3 volts. The SDATA stream is ultimately output from pad 208 with the voltage swing corresponding to voltage domain 1.

Figure 2B:
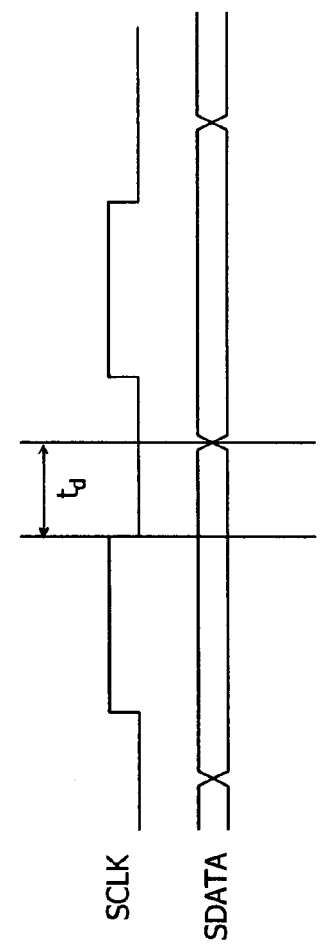
FIG. 2B is a timing diagram illustrating the typical delays through the serial data processing path shown in FIG. 2A.

FIG. 2B illustrates the delay between the falling edge of the SCLK signal received at pad 201 and the output of the corresponding bit of the SDATA stream at pad 208. While the present discussion, including the description below of the present inventive principles, is based on exemplary systems in which the SDATA bits are output from the source device in response to the falling edges of the SCLK signal and latched-in at the destination device in response to the rising edges of the SCLK signal, in alternate embodiments, the SDATA bits may equivalently be output from the source device in response to the rising edges of the SDATA signal and latched by the destination device in response to the falling edges of SCLK signal.

In FIG. 2B, the delay $t_d$ is approximately the sum of the delays through pad 201, level shifter 202, gating circuitry 203, synchronization circuit 205, gating circuitry 206, level shifter 207, and pad 208. For a typical ADC integrated circuit, the total delay through both pads 201 and 208 will be on the order of 10-12 nanoseconds. The delays through gating circuitry 203, synchronization circuitry 205, and gating circuitry 206, will generally be very small, typically on the order of 5 nanoseconds total. On the other hand, the total delay through level shifters 202 and 207 is typically on the order of 15-20 nanoseconds, which represents a significant portion of the overall delay $t_d$.

In a typical system, a sufficiently long setup period $t_{su}$ must be provided between the output of the current bit of the SDATA stream and the next rising edge of the SCLK signal such that the destination device receiving the SDATA stream can properly capture and latch that current serial data bit. Hence, as shown in FIG. 2B, in order to ensure a sufficiently long setup time $t_{su}$, the highest frequency of the SCLK signal must be limited and/or the total delay between receiving the falling edge of the SCLK signal at pad 201 and the output of the corresponding bit at pad 208 must be reduced. According to the principles of the present invention, the total delay $t_d$ is reduced by eliminating delays introduced between the falling edge of the SCLK signal and the output of the corresponding bit of the SDATA stream by level shifters 202 and 207.

Figure 3A:
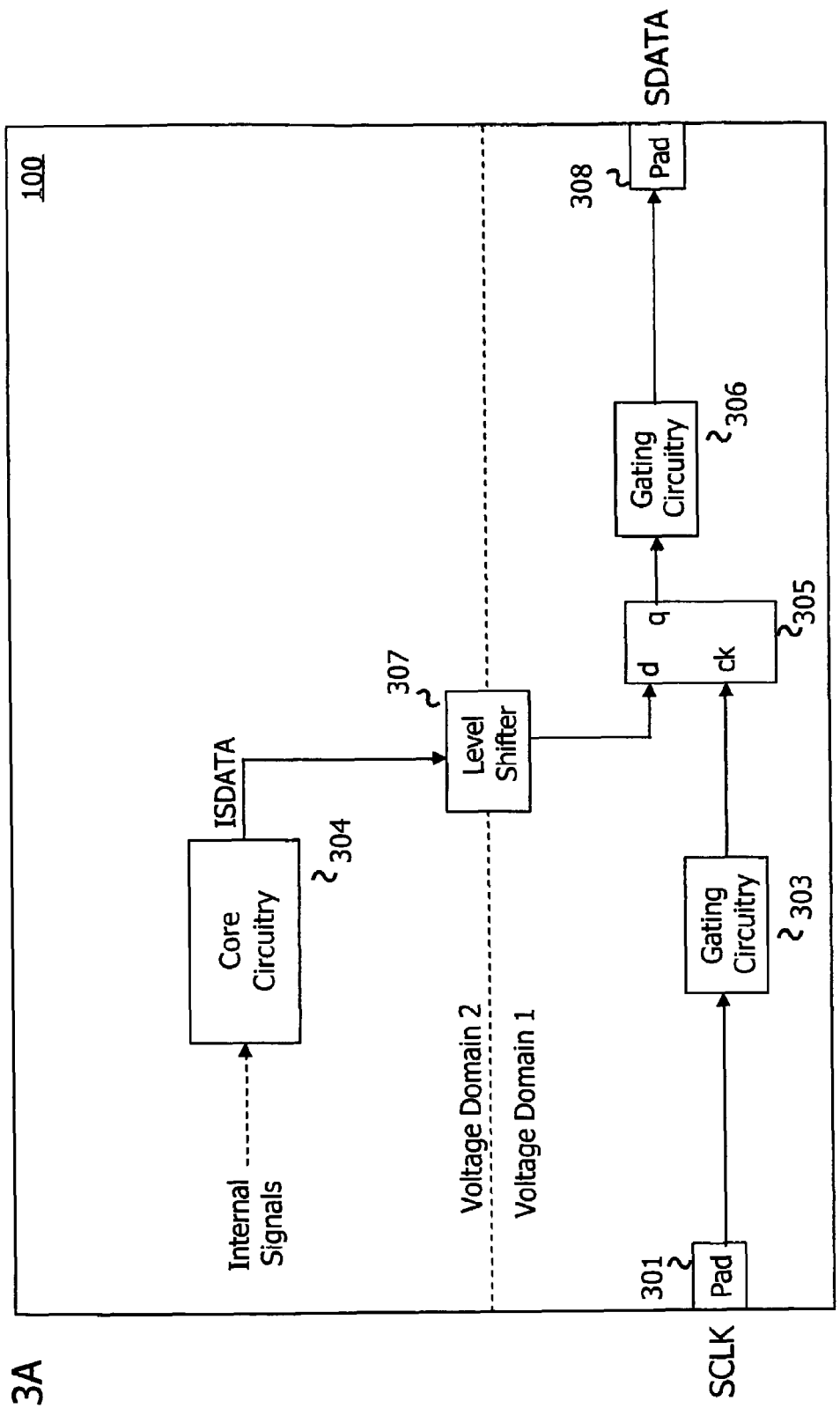
FIG. 3A is a block diagram of a representative serial data processing path embodying the principles of the present invention and suitable for utilization in the ADC of FIG. 1.

FIG. 3A illustrates a portion of the serial data generation circuitry of ADC 100 of FIG. 1 according to a representative embodiment of the principles of the present invention. Generally, as shown in FIG. 3A, the level shifters have been removed from the critical sclk signal path.

As shown in FIG. 3A, gating circuitry 303, synchronization circuitry 305, and gating circuitry 306 operate within voltage domain 1. The internal serial data ISDATA is generated from the corresponding internal signals in the core circuitry 304 in voltage domain 2 and then level shifted by a level shifter 307 into voltage domain 1. The SCLK signal is passed directly through SCLK pad 301 and gating circuitry 303 to the clock input of a synchronization circuitry 305. Synchronization circuitry 305 then synchronizes the internal serial data stream ISDATA with the SCLK signal in voltage domain 1. The synchronized internal serial data stream ISDATA is then passed through gating circuitry 306 and output through pad 308 as the external serial data stream SDATA. Since the SCLK signal never passes through a level shifter, the total delay $t_d$ between the falling edge of the SCLK signal and the output of the corresponding bit of the SDATA stream is reduced to the delays through pads 301 and 308, gating circuitry 303, synchronization circuitry 305, and gating circuitry 306. Hence, the delay between the receipt of the falling edge of the SCLK signal and the output of the corresponding bit of the SDATA stream has been reduced by approximately 15-20 nanoseconds over the embodiment shown in FIG. 2A. As a result, a longer set up time $t_{su}$ is available for use by the destination device to capture and latch the current bit of the SDATA stream and/or a higher frequency SCLK signal may be utilized.

Figure 3B:
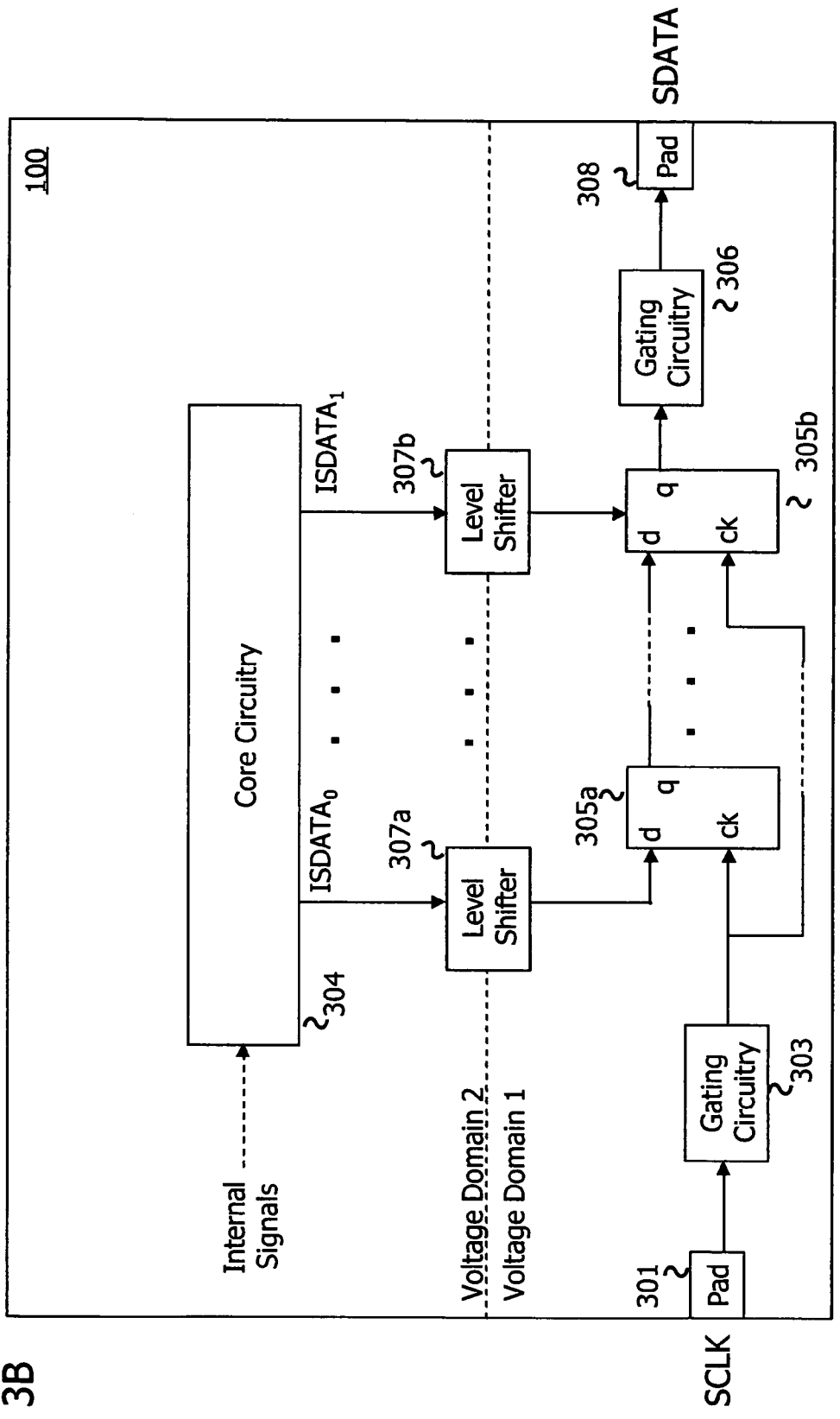
FIG. 3B is a block diagram of another representative serial data processing path embodying the principles of the present invention and suitable for utilization in the ADC of FIG. 1.

FIG. 3B illustrates an alternate embodiment of ADC 100 of FIG. 1 according to the principles of the present invention. In the embodiment of FIG. 3B, core logic 304 generates a plurality of internal serial data bits, two of which ISDATA$_0$ and ISDATA$_1$, are shown for reference. Each bit output from core logic 304 is translated from voltage domain 2 to voltage domain 1 by a corresponding level shifter 307a-307b and then provided the input of a shift register represented in FIG. 3B by synchronization circuits 305a and 305b. The data loaded into synchronization circuits 305a and 305b are then shifted out through the SDATA port provided by pad 308 in response to the SCLK signal.

Similar to the embodiment of FIG. 3A, in the embodiment of ADC 100 shown in FIG. 3B, level shifters have been taken out of the critical SCLK signal path. In particular, the SCLK signal only passes through circuits which operate in voltage domain 1, and therefore is not subjected to any level shifting delays.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A method of interfacing circuits operating in different voltage domains comprising:
   receiving a first signal with a first circuit operating in a first voltage domain;
   generating a second signal with a second circuit operating in a second voltage domain, wherein the first signal comprises a clock signal and the second signal comprises data;
   level shifting the second signal between the first and second voltage domains with a level shifter; and
   synchronizing the level shifted second signal with the first signal with a third circuit operating in the first voltage domain.

2. The method of claim 1, wherein the first, second, and third circuits are fabricated on a single integrated circuit chip.

3. The method of claim 2, wherein the first circuit comprises a pad on the integrated circuit for receiving an externally generated signal.

4. The method of claim 1, wherein the first signal comprises a serial clock signal and the second signal comprises serial data.

5. The method of claim 1, wherein level shifting comprises shifting a voltage swing of the second signal from a larger voltage swing to a smaller voltage swing.

6. The method of claim 1, wherein level shifting comprises shifting a voltage swing of the second signal from a smaller voltage swing to a larger voltage swing.

7. A method of interfacing circuits operating in different voltage domains comprising:
   receiving a first signal with a first circuit operating in a first voltage domain;
   generating a second signal with a second circuit operating in a second voltage domain;
   level shifting the second signal between the first and second voltage domains with a level shifter;
   synchronizing the level shifted second signal with the first signal with a third circuit operating in the first voltage domain;
   generating a fourth signal in parallel with the first signal with the second circuit;
   level shifting the fourth signal between the first and second voltage domains with another level shifter; and
   synchronizing the level shifted fourth signal with the first signal in serial with the second signal with the third circuit.

8. An integrated circuit including circuits operating in different voltage domains comprising:
   input circuitry operating in a first voltage domain for receiving a first signal;
   core circuitry operating in a second voltage domain for generating a second signal, wherein the first signal comprises a digital clock signal and the second signal comprises digital data;
   a level shifter for shifting the second signal between the first and second voltage domains; and
   synchronization circuitry operating in the first voltage domain for synchronizing the level shifted second signal with the first signal.

9. The integrated circuit of claim 8, wherein input circuitry comprises a pad for interfacing the integrated circuit with an external circuit.

10. The integrated circuit of claim 8, wherein the digital clock signal comprises a serial clock signal and the digital data comprises serial data.

11. The integrated circuit of claim 8, wherein the level shifter shifts a voltage swing of the second signal from a larger voltage swing to a smaller voltage swing.

12. The integrated circuit of claim 8, wherein the level shifter shifts a voltage swing of the second signal from a smaller voltage swing to a larger voltage swing.

13. An integrated circuit including circuits operating in different voltage domains comprising:
   input circuitry operating in a first voltage domain for receiving a first signal;
   core circuitry operating in a second voltage domain for generating a second signal and a fourth signal in parallel with the second signal;
   a level shifter for shifting the second signal between the first and second voltage domains; and
   synchronization circuitry operating in the first voltage domain for synchronizing the level shifted second signal with the first signal;
   another level shifter for shifting the fourth signal between the first and second voltage domains; and
   synchronizing circuitry for synchronizing the level shifted fourth signal with the first signal in serial with the second signal.

14. A data converter disposed on an integrated circuit chip comprising:
   clock input circuitry for inputting a clock signal having a first voltage swing between a low voltage rail and a high voltage rail;

core logic for generating an output stream of data bits having second voltage swing between the low voltage rail and another high voltage rail;

a level shifter for shifting the data bits of the output stream from the second voltage swing to the first voltage swing to generate a level shifted output stream;

synchronization circuitry operating on signals having the first voltage swing for synchronizing the level shifted output stream with the clock signal to generate a synchronized level shifted output stream; and output circuitry operating on signals having the first voltage swing for outputting the synchronized level shifted output stream.

15. The data converter of claim 14, wherein the core logic comprises analog to digital conversion circuitry.

16. The data converter of claim 15, wherein the clock signal comprises a serial clock and the synchronized level shifted output stream comprises a serial data stream.

17. The data converter of claim 14, wherein the high voltage rail is lower in voltage than the another high voltage rail.

18. The data converter of claim 14, wherein the high voltage rail is higher in voltage than the another high voltage rail.

* * * * *